United States Patent [19]
Tseng

[11] Patent Number: 6,046,906
[45] Date of Patent: *Apr. 4, 2000

[54] VENT CHIMNEY HEAT SINK DESIGN FOR AN ELECTRICAL ASSEMBLY

[75] Inventor: Richard Tseng, Lacey, Wash.

[73] Assignee: Intel Corporation, Santa Clara, Calif.

[*] Notice: This patent issued on a continued prosecution application filed under 37 CFR 1.53(d), and is subject to the twenty year patent term provisions of 35 U.S.C. 154(a)(2).

[21] Appl. No.: 09/151,538

[22] Filed: Sep. 11, 1998

[51] Int. Cl.⁷ ....................................... H05K 7/20
[52] U.S. Cl. .................. 361/704; 361/703; 361/709; 361/717; 361/719; 361/749; 257/687; 257/706; 257/717; 174/16.3; 174/52.4; 165/80.3; 165/185
[58] Field of Search ............................ 361/690, 704–721, 361/727, 683, 687–692, 799; 165/80.1, 80.2, 80.3, 104.33, 129, 185, 80.4; 257/706–727, 796, 730; 24/458, 457; 439/69, 66; 174/51, 52.3, 16.2, 252, 16.3

[56] References Cited

U.S. PATENT DOCUMENTS

| | | | |
|---|---|---|---|
| 5,280,409 | 1/1994 | Selna et al. | 361/720 |
| 5,396,403 | 3/1995 | Patel | 361/705 |
| 5,831,828 | 11/1998 | Cutting et al. | 361/704 |
| 5,831,830 | 11/1998 | Mahler | 361/704 |
| 5,847,928 | 12/1998 | Hinshaw | 361/704 |
| 5,870,288 | 2/1999 | Chen | 361/704 |

*Primary Examiner*—Leo P. Picard
*Assistant Examiner*—Michael Datskovsky
*Attorney, Agent, or Firm*—Blakely, Sokoloff, Taylor & Zafman LLP

[57] ABSTRACT

An electronic assembly which includes a heat sink. The assembly includes first and second integrated circuit packages that are mounted to a substrate. The heat sink may be in direct thermal contact with the first integrated circuit package and include a channel that is located adjacent to the second integrated circuit package. The channel allows air to flow across the second integrated circuit package and remove heat generated within the package.

32 Claims, 5 Drawing Sheets

VENT CHIMNEY HEAT SINK DESIGN FOR AN ELECTRICAL ASSEMBLY

BACKGROUND OF THE INVENTION

1. Field of the Invention

The present invention relates to an electronic cartridge which has a heat sink.

2. Background Information

FIG. 1 shows a product marketed by Intel Corporation, the assignee of this application, which is referred to as a single edge contact cartridge (SECC). The Intel SECC includes a microprocessor which is assembled into a package 1 that is mounted to a substrate 2. The SECC may also have other integrated circuit packages 3 which contain static random access memory (SRAM) integrated circuits.

One edge of the substrate 2 has a plurality of conductive pads 4 which can be inserted into an electrical connector 5. The electrical connector 5 can be mounted to a printed circuit board 6 such as the motherboard of a computer. The pads 4 and connector 5 electrically couple the substrate 2 to the circuit board 6.

The substrate 2 and integrated circuit packages 1 and 3 are enclosed by a cover 7 and a thermal plate 8. The cover 7, plate 8 and substrate 2 provide an electronic cartridge which can be plugged into a computer.

The electrical system shown in FIG. 1 can be subjected to external shock and vibration loads. Such loads may produce intermittent separation between the pads 4 and the connector 5. Intermittent separation between the pads 4 and connector 5 may create electrical "opens." The system is provided with a retention mechanism 9 to secure the substrate 3 to the connector 5 and prevent contact separation under shock and vibration loads.

The retention mechanism 9 includes a pair of guide rails 10 that are mounted to the circuit board 6. Each rail 10 includes an aperture 11 which receives a latch 12 that extends from the cover 7 of the cartridge. When inserted into the aperture 11 each latch 12 prevents the substrate 2 from being pulled out of the connector 5. The substrate 2 can be unplugged from the connector 5 by pressing a pair of latch levers 13 and pulling the cartridge away from the board 6. Pressing the levers 13 moves the latches 12 out of the apertures 11 of the rails 10.

The integrated circuits generate heat which must be removed from the circuits. The thermal plate 8 is thermally coupled to the integrated circuit package 1 of the SECC to provide a thermal path for the heat generated by the microprocessor. A heat sink 14 may be mounted to the thermal plate 8 to further facilitate the removal of heat.

As shown in FIG. 2, the thermal plate 8 is in direct thermal contact with the package 1 that contains the microprocessor so that heat can flow from the package 1, through the plate 8, and into the heat sink 14. The package 1 typically incorporates a heat slug 15 which makes the package taller than the SRAM packages 3. Consequently, there is an air gap 16 between the SRAM packages 3 and the thermal plate 8. Air is a thermal insulator. Therefore, heat generated by the SRAM devices primarily flows into the substrate which is a relatively inefficient means of removing heat from the packages 3.

A heat slug (not shown) can be attached to the heat sink 14 to fill the air gap 16 and provide a direct thermal path between the SRAM packages 3 and the sink 14. Attaching a heat slug to the heat sink 14 increase the complexity and cost of producing the assembly. It would be desirable to provide a cost effective heat sink design that will allow heat to be removed from the top surface of the SRAM packages 3.

SUMMARY OF THE INVENTION

One embodiment of the present invention includes a heat sink which has a channel in a pedestal and a fin that extends from the pedestal.

DETAILED DESCRIPTION OF THE INVENTION

One embodiment of the present invention includes an electronic assembly which includes a heat sink. The assembly includes first and second integrated circuit packages that are mounted to a substrate. The heat sink may be in direct thermal contact with the first integrated circuit package and include a channel that is located adjacent to the second integrated circuit package. The channel allows air to flow across the second integrated circuit package and remove heat generated within the package.

Figure 1:
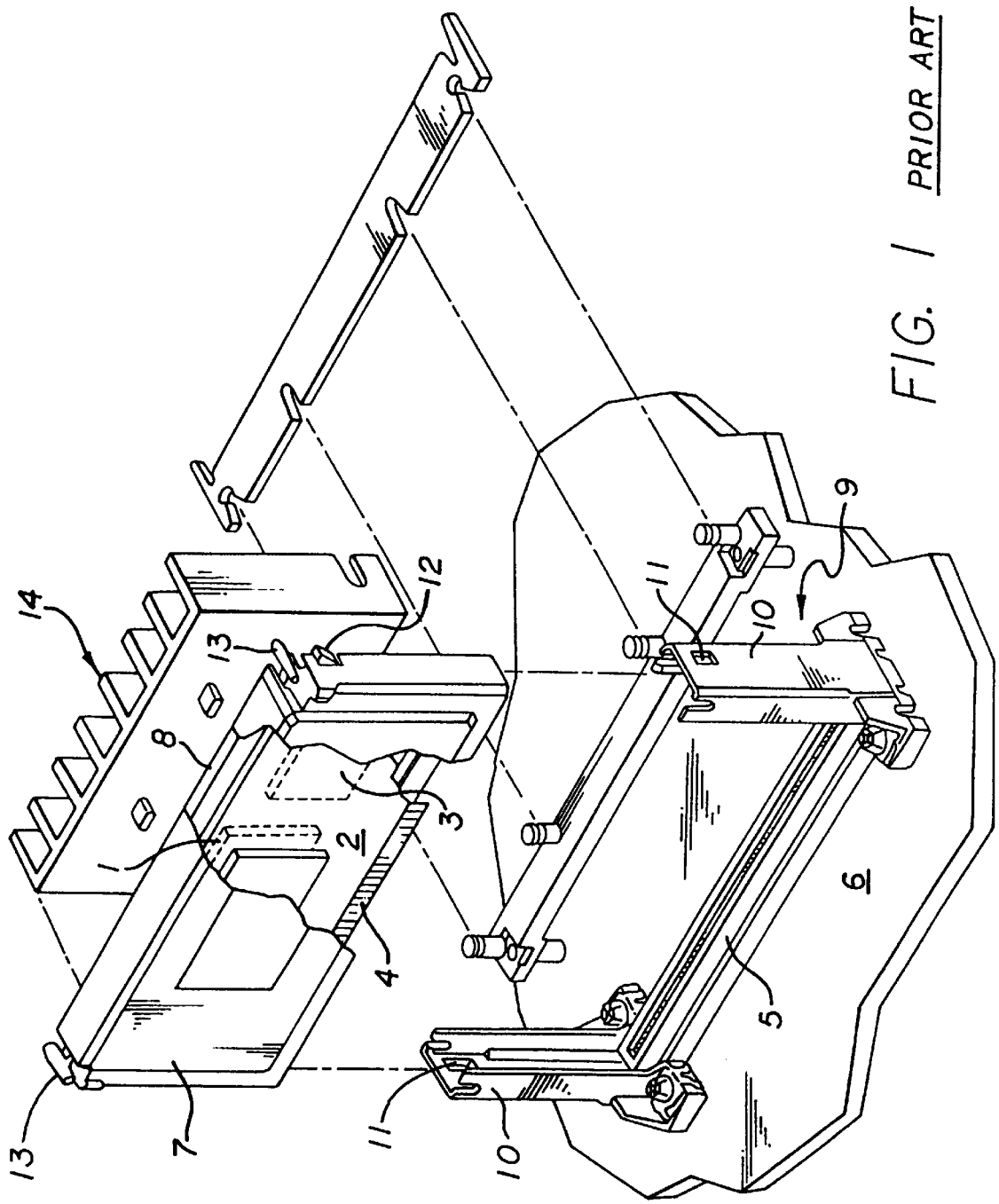
FIG. 1 is a perspective view of an electrical assembly of the prior art.
Figure 2:
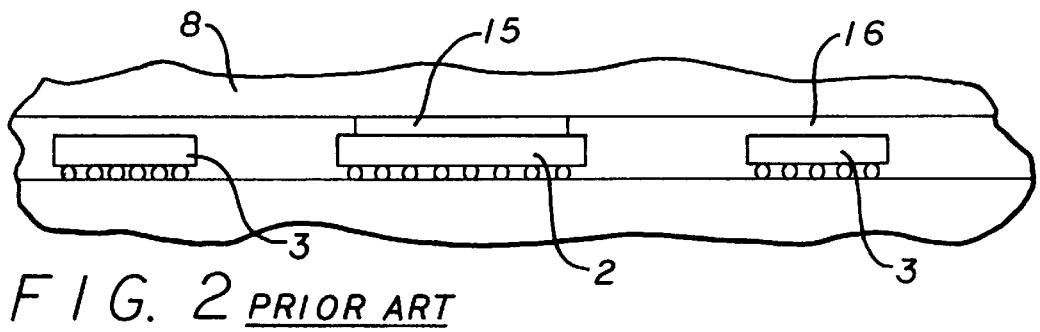
FIG. 2 is a side sectional view of the assembly of FIG. 1.
Figure 4:
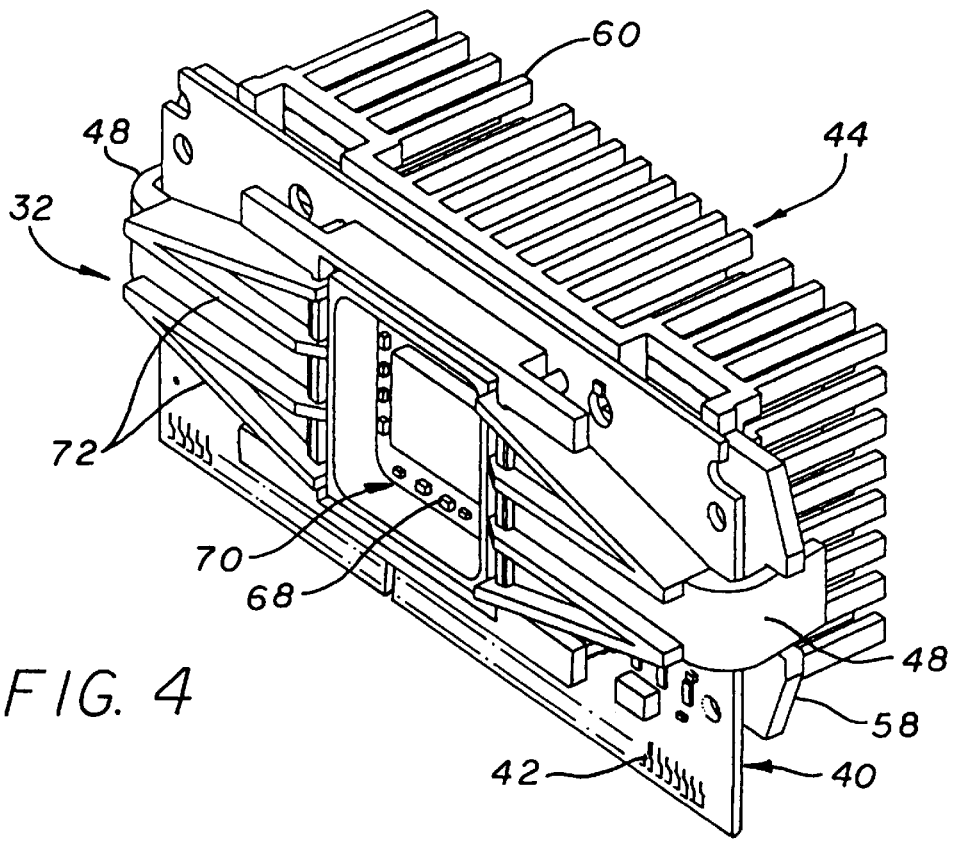
FIG. 4 is a perspective view of an assembled electronic assembly.
Figure 3:
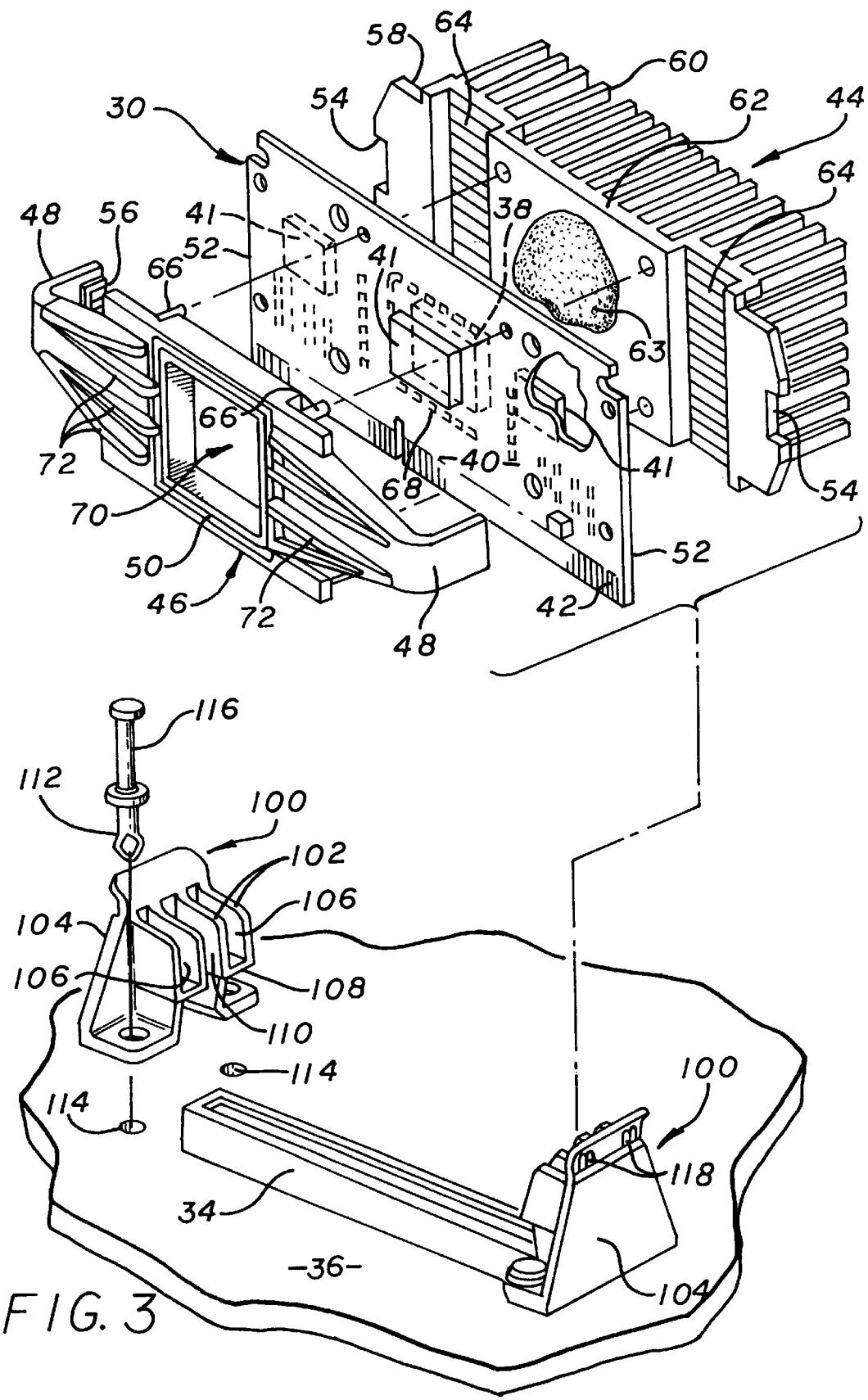
FIG. 3 is a perspective view of an embodiment of an electrical assembly of the present invention.

Referring to the drawings more particularly by reference numbers, FIGS. 3 and 4 show an embodiment of an electrical assembly 30 of the present invention. The assembly 30 includes an electronic assembly 32 that can be plugged into an electrical connector 34. The connector 34 may be mounted to a printed circuit board 36. The printed circuit board 36 may be a motherboard of a computer.

The electronic assembly 32 may include a first integrated circuit packages 38 that are mounted to a substrate 40. Each integrated circuit package 38 may contain an integrated circuit (not shown) such as a microprocessor. The assembly 32 may also include a number of second integrated circuit packages 41 that are mounted to the substrate 40. The second integrated circuit packages 41 may include memory devices such as static random access memory (SRAM) or a co-processor.

The substrate 40 may be a printed circuit board. One edge of the substrate 40 may have a plurality of contacts 42 that can be inserted into the electrical connector 34. The substrate 40 may have routing traces, power/ground planes, vias, surface pads, etc. which electrically connect the integrated circuit packages 38 and 41 to the contacts 42.

The electronic assembly 32 may have a heat sink 44 that is attached to the substrate 40 by a clip 46. The clip 46 may include a pair of arms 48 that extend from a center portion 50. The arms 48 may extend around edges 52 of the substrate 40. The arms 48 may be pressed into a pair of slots 54 located at opposite ends of the heat sink 44.

Figure 5:
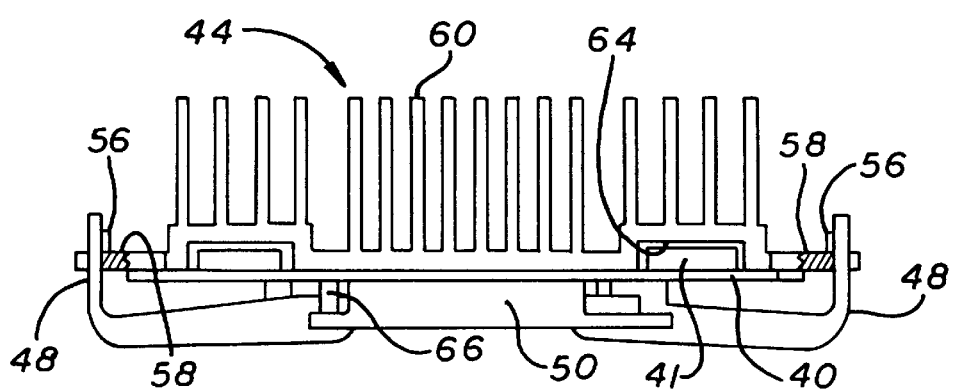
FIG. 5 is a top view of the electronic assembly.

As shown in FIG. 5, the arms 48 attach the heat sink 44 to the substrate 40. Each arm 48 may have a tab 56 that "snaps" onto a rear surface 58 of the heat sink 44. The tabs 56 prevent movement of the heat sink 44 away from the substrate 40. The interlocking relationship between the arms 48 and the slots 54 also prevents lateral movement of the heat sink 44.

The heat sink 44 may include a plurality of fins 60 that extend from a pedestal 62. The arms 48 may exert a force which presses a portion of the pedestal 62 into the first integrated circuit package 38 to provide a direct thermal path between the package 38 and the sink 44. A thermal grease 63 may be located between the package 38 and the heat sink 44 to eliminate air voids between the components. The first package 38 may have a heat slug (not shown) integrated therein which is in thermal contact with the pedestal.

The heat sink 44 may also have a pair of channels 64 formed in the pedestal 62. The channels 64 are located adjacent to the second integrated circuit packages 41. The entire assembly 30 is typically installed into a higher assembly which includes a fan (not shown) that can generate a flow of air. The channels 64 allow the air to flow across the second integrated circuits packages 41 to remove heat generated within the packages 41.

The channels 64 can be extruded with the fins 60 and the pedestal 62 of the heat sink 44. The present invention thus provides a low cost heat sink that can effectively remove heat from the second integrated circuit packages 41.

The center portion 50 of the clip 46 may have a plurality of posts 66 that provide a spacer so that the integrated circuit package 41 and other electrical components 68 can be mounted to the substrate 40 without interference with the clip 46. The center portion 50 may also have a center opening 70 which provides additional clearance for the integrated circuit package 41.

The clip 46 may be constructed from a plastic material which is flexible enough so that the arms 48 can be bent around the substrate 40 and snapped into the heat sink slots 54. The clip 46 may have integral ribs 72 that provide structural support while allowing the arms 48 to be bent around the substrate 40.

Figure 6:
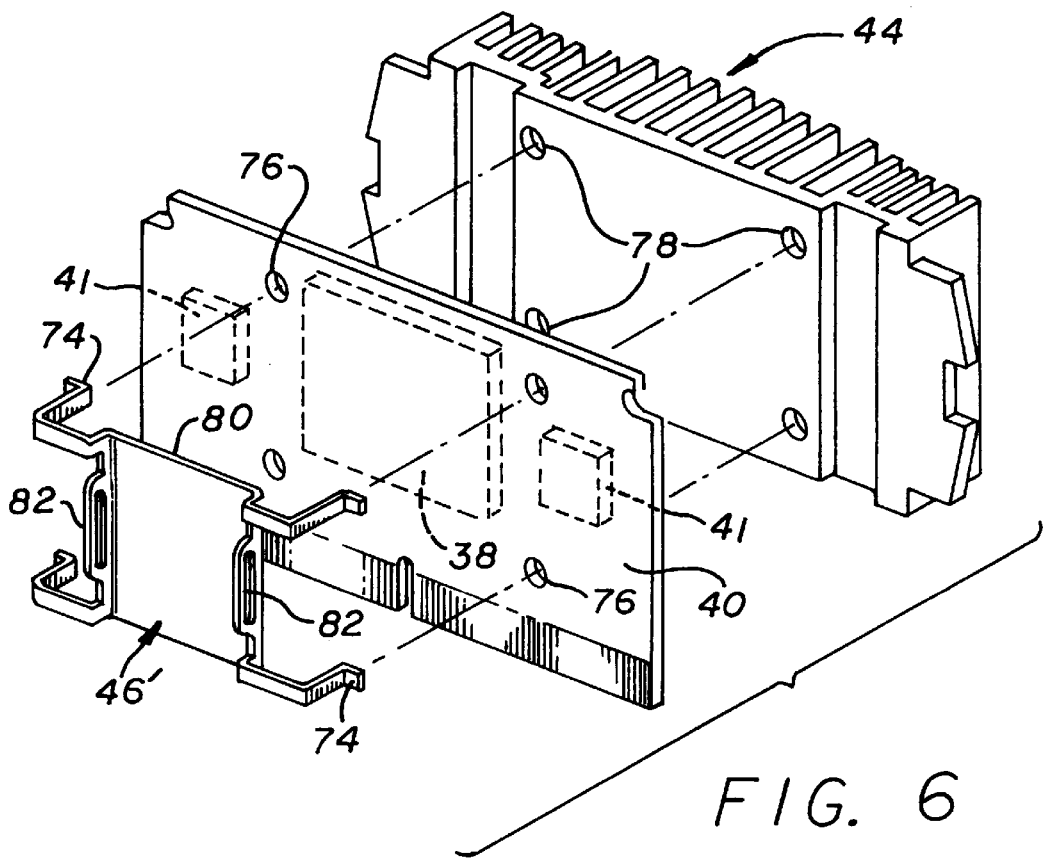
FIG. 6 is a perspective view of an alternate embodiment of a clip that attaches the heat sink to the substrate.

FIG. 6 shows an alternate embodiment of a clip 46'. The clip 46' may have a plurality of L-shaped ears 74 that are inserted through clearance holes 76 in the substrate 40 and corresponding attachment holes 78 in the heat sink 44. The clip 46' may have four ears 74 which extend from a center plate portion 80. The L-shaped ears 74 are bent during insertion through the holes 76 and 78. There may be provided a tool (not shown) which bends the ears 74 during the insertion step. The clip 46' may be constructed from a steel material which does not yield during the assembly process. The center plate portion 80 may have a pair of handles 82 that allow an operator to more easily grasp the clip 46' during installation.

Figure 7:
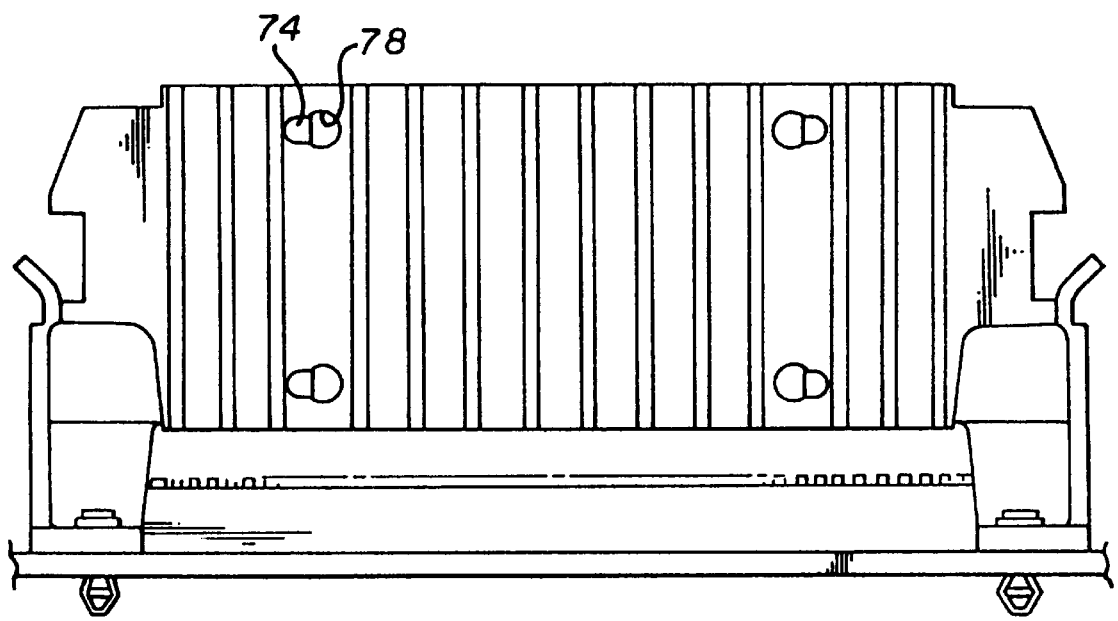
FIG. 7 is a rear view of the clip of FIG. 5, attached to the heat sink.

As shown in FIG. 7, the L-shaped ears 74 snap back after clearing the attachment holes 78 of the heat sink 44. When assembled, the clip 46' may exert a spring force that pushes the heat sink 44 into the integrated circuit package 38.

Figure 8:
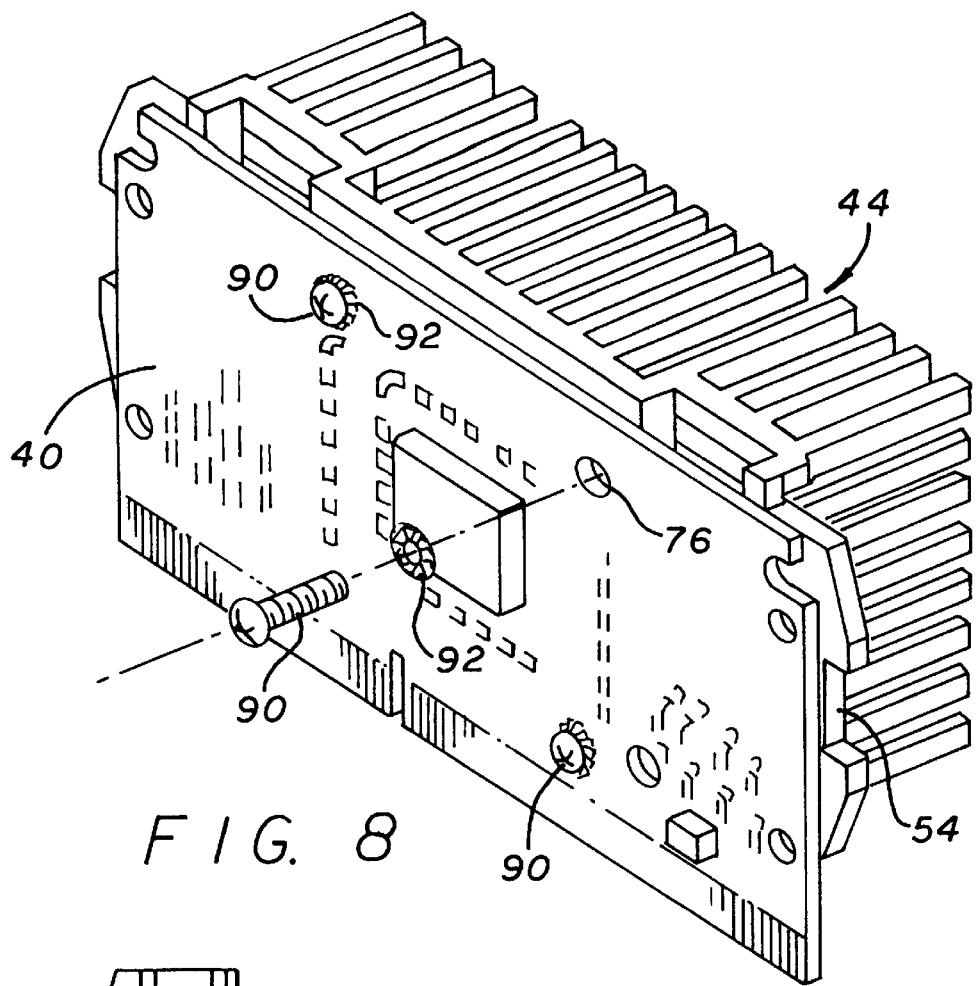
FIG. 8 is a perspective view of an alternate embodiment wherein the heat sink is attached to the substrate by a bolt.

FIG. 8 shows another embodiment wherein the heat sink 14 is attached to the substrate 40 by a plurality of bolts 90 and corresponding spring washers 92. The bolts 90 may extend through the clearance holes 76 in the substrate 40. The bolts 90 may be screwed into threaded holes (not shown) tapped into the heat sink 44. Alternatively, the bolts 90 may extend through clearance holes in the heat sink 44 and become attached to nuts (not shown) and corresponding washers located on an opposite surface of the heat sink 44.

Referring to FIG. 3, the assembly 30 may include a pair of retention mechanisms 100 that are mounted to the substrate 40. The retention mechanisms 100 retain and support the electronic assembly 32. The mechanism 100 may include a plurality of first walls 102 which extend from a backwall 104 and are separated from each other by a pair of heat sink slots 106. The walls 102 are adjoined by a base portion 108. The heat sink 44 may be inserted into either slot 106. The walls 102 may be separated from each other by a substrate slot 110. The substrate slot 110 may provide a clearance for the substrate 40 to be inserted into the connector 34.

Each retention mechanism 100 may have a pair of studs 112 that are pressed into a pair of corresponding holes 114 in the printed circuit board 36. Pins 116 may be pressed into the retention studs 114 to expand the studs 114 and secure the retention mechanism 100 to the circuit board 36. The retention mechanism 100 may have a pair of latch apertures 118.

Figure 9:
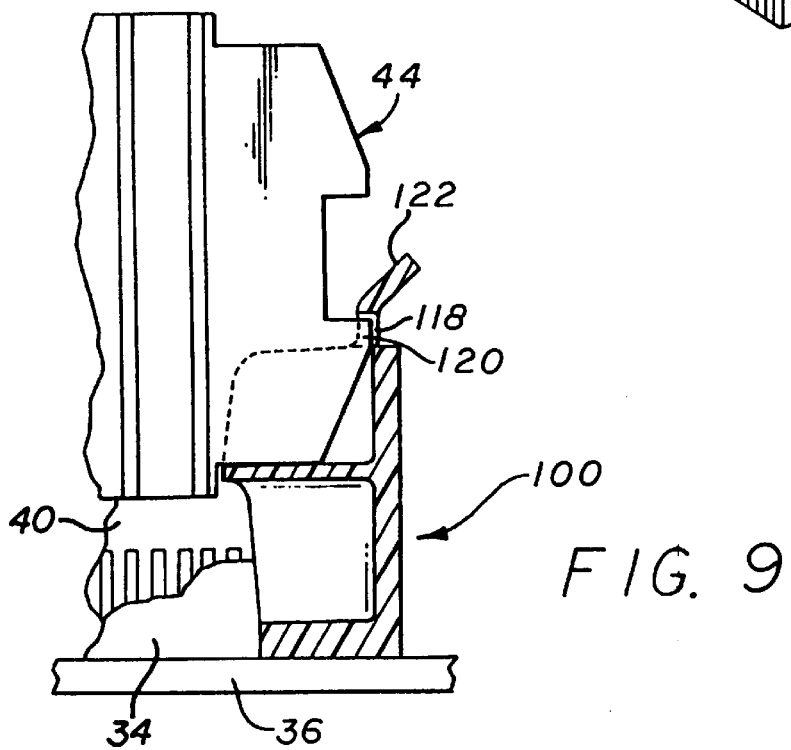
FIG. 9 is a side sectional view of a substrate and a heat sink inserted into a retention mechanism.

As shown in FIG. 9, one of the latch apertures 118 may receive a tab 120 of the heat sink 44. When inserted into the aperture 118, the tab 120 prevents the electronic assembly 32 from being pulled out of the connector 34. To remove the assembly 32 an operator can depress a latch arm 122 so that the tab 120 is separated from the retention mechanism 100. For an assembly 30 with two retention mechanism 100 the operator can decouple tabs 120 located on both sides of the heat sink 44. Once the tabs 120 are decoupled from the retention mechanisms 100 the operator can pull the substrate 40 out of the connector 34.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. An electronic assembly, comprising:
   a substrate that has a plurality of contacts along an edge of said substrate;
   a first integrated circuit package that is mounted to said substrate and has a top surface;

a heat sink that has a conductive heat exchange surface coupled to said top surface of said first integrated circuit package and has a channel that is recessed from said conductive heat exchange surface; and, a second integrated circuit package mounted to said substrate and located within said channel of said heat sink to allow convective heat transfer from a top surface of said second integrated circuit package.

2. The assembly as recited in claim 1, further comprising a clip that attaches said heat sink to said substrate.

3. The assembly as recited in claim 2, wherein said clip exerts a spring force which presses said heat sink toward said first integrated circuit package.

4. The assembly as recited in claim 1, further comprising a thermal grease located between said heat sink and said integrated circuit package.

5. The assembly as recited in claim 1, wherein said heat sink includes a plurality of fins which extend from a pedestal, said pedestal including said channel.

6. The assembly as recited in claim 3, wherein said clip includes an arm which extends from a center portion, said arm extends around an edge of said substrate and is attached to said heat sink.

7. The assembly as recited in claim 6, wherein said center portion includes a post that is pressed into said substrate.

8. The assembly as recited in claim 6, wherein said heat sink has a slot that receives said arm of said clip.

9. The assembly as recited in claim 6, wherein said arm includes a tab that captures said heat sink.

10. The assembly as recited in claim 3, wherein said clip includes an L-shaped ear that extends through a clearance hole in said substrate and a clearance hole in said heat sink.

11. The assembly as recited in claim 2, further comprising a bolt that extends through a clearance hole in said substrate and is attached to said heat sink.

12. A method for assembling an electronic assembly, comprising:

a) coupling a conductive heat exchange surface of a heat sink to a first integrated circuit package that is mounted to a substrate to provide a conductive path between said first integrated circuit package and the heat sink, said heat sink having a channel that is recessed from the conductive heat exchange surface and located adjacent to a second integrated circuit package which is mounted to said substrate so that the second integrated circuit package is located with the channel to allow convective heat transfer from a top surface of the second integrated circuit package; and, inserting contacts located along an edge of the substrate into a connector.

13. The method as recited in claim 12, further comprising the step of directing a flow of air through said channel.

14. An electronic assembly, comprising:

a substrate;

a first integrated circuit that is mounted to said substrate and has a top surface;

a heat sink that has a conductive heat exchange surface coupled to said top surface of said first integrated circuit package and has a channel that is recessed from said conductive heat exchange surface;

a second integrated circuit package mounted to said substrate and located within said channel of said heat sink to allow convective heat transfer from a top surface of said second integrated circuit package; and, a clip that has an arm which extends around an end of said substrate and attaches said heat sink to said substrate, said arm extends from a center portion which has a post pressed into said substrate.

15. The assembly as recited in claim 14, wherein said clip exerts a spring force which presses said heat sink toward said first integrated circuit package.

16. The assembly as recited in claim 14, further comprising a thermal grease located between said heat sink and said integrated circuit package.

17. The assembly as recited in claim 14, wherein said heat sink includes a plurality of fins which extend from a pedestal, said pedestal including said channel.

18. The assembly as recited in claim 14, wherein said heat sink has a slot that receives said arm of said clip.

19. The assembly as recited in claim 14, wherein said arm includes a tab that captures said heat sink.

20. An electronic assembly, comprising:

a substrate;

a first integrated circuit package that is mounted to said substrate and has a top surface;

a heat sink that has a conductive heat exchange surface coupled to said top surface of said first integrated circuit package and has a channel that is recessed from said conductive heat exchange surface;

a second integrated circuit package mounted to said substrate and located within said channel of said heat sink to allow convective heat transfer from a top surface of said second integrated circuit package; and, a clip that has an arm with a tab that extends around an edge of said substrate and attached said heat sink to said substrate.

21. The assembly as recited in claim 20, wherein said clip exerts a spring force which presses said heat sink toward said first integrated circuit package.

22. The assembly as recited in claim 20, further comprising a thermal grease located between said heat sink and said integrated circuit package.

23. The assembly as recited in claim 20, wherein said heat sink includes a plurality of fins which extend from a pedestal, said pedestal including said channel.

24. The assembly as recited in claim 20, wherein said clip includes an arm which extends from a center portion, said arm extends around an edge of said substrate and is attached to said heat sink.

25. The assembly as recited in claim 20, wherein said heat sink has a slot that receives said arm of said clip.

26. An electronic assembly, comprising:

a substrate;

a first integrated circuit package that is mounted to said substrate and has a top surface;

a heat sink that has a conductive heat exchange surface coupled to said top surface of said first integrated circuit package and has a channel that is recessed from said conductive heat exchange surface;

a second integrated circuit package mounted to said substrate and located within said channel of said heat sink to allow convective heat transfer from a top surface of said second integrated circuit package; and, a clip that has an L-shaped ear that extends through clearance holes in said substrate and said heat sink to attach said heat sink to said substrate.

27. The assembly as recited in claim 26, wherein said clip exerts a spring force which presses said heat sink toward said first integrated circuit package.

28. The assembly as recited in claim 26, further comprising a thermal grease located between said heat sink and said integrated circuit package.

29. The assembly as recited in claim 26, wherein said heat sink includes a plurality of fins which extend from a pedestal, said pedestal including said channel.

30. The assembly as recited in claim 26, wherein said substrate has a plurality of contacts along an edge of said substrate.

31. The assembly as recited in claim 26, further comprising a bolt that extends through a clearance hole in said substrate and is attached to said heat sink.

32. An electronic assembly, comprising:

a substrate;

a first integrated circuit package mounted to said substrate;

a heat sink that has a conductive heat exchange surface coupled to said top surface of said first integrated circuit package and has a channel that is recessed from said conductive heat exchange surface;

a second integrated circuit package mounted to said substrate and located within said channel of said heat sink to allow convective heat transfer from a top surface of said second integrated circuit package; and, a bolt that extends through a clearance hole in said substrate and is attached to said heat sink.

* * * * *